United States Patent
Lin et al.

(10) Patent No.: US 11,910,564 B2
(45) Date of Patent: Feb. 20, 2024

(54) LIQUID COOLING DEVICE AND MANUFACTURING METHOD THEREOF

(71) Applicant: COOLER MASTER CO., LTD., New Taipei (TW)

(72) Inventors: Wei-Pin Lin, New Taipei (TW); Zhong-Long Zhu, New Taipei (TW); Yi-Cheng Chen, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 58 days.

(21) Appl. No.: 17/398,737

(22) Filed: Aug. 10, 2021

(65) Prior Publication Data

US 2022/0071056 A1 Mar. 3, 2022

(30) Foreign Application Priority Data

Aug. 27, 2020 (CN) .......................... 202010877260.2

(51) Int. Cl.
*H05K 7/20* (2006.01)
*H01L 23/473* (2006.01)
*F28F 3/08* (2006.01)

(52) U.S. Cl.
CPC ........... *H05K 7/20263* (2013.01); *F28F 3/08* (2013.01); *H01L 23/473* (2013.01); *H05K 7/20309* (2013.01); *H05K 7/20409* (2013.01); *F28F 2255/00* (2013.01)

(58) Field of Classification Search
CPC ....... F28D 2021/0029; F28F 3/08; F28F 3/12; H01L 23/433; H01L 23/473; H05K 7/20254; H05K 7/20263; H05K 7/20272; H05K 7/20309; H05K 7/20409
See application file for complete search history.

(56) References Cited

U.S. PATENT DOCUMENTS

| | | | | |
|---|---|---|---|---|
| 5,490,559 | A * | 2/1996 | Dinulescu | F28D 1/05366 165/165 |
| 5,494,098 | A * | 2/1996 | Morosas | H01L 23/467 29/890.035 |
| 8,238,102 | B2 * | 8/2012 | Wei | H01L 23/427 361/717 |
| 9,909,820 | B2 * | 3/2018 | Lyon | H01L 23/473 |
| 2002/0070007 | A1 * | 6/2002 | Calaman | H01L 23/473 257/E23.098 |
| 2004/0068991 | A1 * | 4/2004 | Banney | F28F 1/045 62/3.3 |
| 2005/0199372 | A1 * | 9/2005 | Frazer | H01L 23/473 165/170 |

(Continued)

*Primary Examiner* — Eric S Ruppert
*Assistant Examiner* — Hans R Weiland
(74) *Attorney, Agent, or Firm* — Maschoff Brennan (57) ABSTRACT

A liquid cooling device includes a thermally conductive base, a cover, and a metallic partition. The thermally conductive base has a fluid chamber and a plurality of fins. The fins are located in the fluid chamber and protrudes from an inner surface of the thermally conductive base facing the fluid chamber. Every two of the fins located adjacent to each other define a channel therebetween. Distal ends of at least part of the fins located away from the inner surface together form a covering structure partially coving the channels. The metallic partition is located between and welded to the covering structure and the cover.

8 Claims, 6 Drawing Sheets

(56) References Cited

U.S. PATENT DOCUMENTS

| | | | |
|---|---|---|---|
| 2006/0283573 A1* | 12/2006 | Thors | H01L 23/473 |
| | | | 165/80.4 |
| 2013/0153186 A1* | 6/2013 | Gotou | H01L 23/473 |
| | | | 165/168 |
| 2013/0175019 A1* | 7/2013 | Phelan | F28D 15/0275 |
| | | | 29/890.032 |
| 2016/0313072 A1* | 10/2016 | Okuaki | F28F 3/02 |
| 2018/0204784 A1* | 7/2018 | Kawase | H01L 23/473 |
| 2018/0228040 A1* | 8/2018 | Lykke | F28F 13/12 |
| 2019/0208669 A1* | 7/2019 | Toh | H05K 7/20418 |
| 2019/0360764 A1* | 11/2019 | Liu | F28F 3/12 |
| 2020/0232715 A1* | 7/2020 | Hanafusa | H05K 7/2039 |
| 2021/0333055 A1* | 10/2021 | Colson | F28D 9/0081 |

* cited by examiner

LIQUID COOLING DEVICE AND MANUFACTURING METHOD THEREOF

CROSS-REFERENCE TO RELATED APPLICATIONS

This non-provisional application claims priority under 35 U.S.C. § 119(a) on Patent Application No(s). 202010877260.2 filed in China on Aug. 27, 2020, the entire contents of which are hereby incorporated by reference.

TECHNICAL FIELD

The described embodiments relate generally to cooling devices and manufacturing method thereof. More particularly, the present embodiments relate to a liquid cooling device and a manufacturing method thereof.

BACKGROUND

Electronic devices contain a variety of different electrical components that generate heat during operation. To prevent these components from overheating, a heat sink attached thereon is required. A heat sink is a passive heat exchanger that transfers the waste heat to a fluid medium, often air or a liquid coolant. It is known that liquid cooling offers a higher level of efficiency and is generally much better at heat management than air alone. The core components of a typical liquid cooling system include water block, pump, tubing, radiator, and fans. Powered by the pump, the liquid is pushed through the water block, tubing, and the radiator, such that the heat absorbed from the water block is transferred to the radiator, and the radiator transfers the heat from the fluid inside to the air outside, thereby cooling the liquid, which in turn cools the heat source.

A typical water block includes a base and fins accommodated therein, the base is the area that makes contact with the component being cooled, and the fins inside the base create more surface area for the coolant to come into contact with. In addition, the water block further includes a rubber partition having a hole for forming a required fluid path.

In addition, some cooling systems employ a suitable refrigerant as the working fluid therein. The refrigerant is able to take away heat by undergoing phase change between liquid and gas. When the refrigerant in liquid phase absorbs the discharged heat and vaporized, it causes the interior pressure of the water block to increase, but such the increase of pressure often damages the rubber partition, resulting in the damage of the water block.

SUMMARY

The disclosure provides a liquid cooling device and a manufacturing method thereof which are capable of having a rigid and strong structure.

One embodiment of the disclosure provides a liquid cooling device. The liquid cooling device includes a thermally conductive base, a cover, and a metallic partition. The thermally conductive base has a fluid chamber and a plurality of fins. The fins are located in the fluid chamber and protrudes from an inner surface of the thermally conductive base facing the fluid chamber. Every two of the fins located adjacent to each other define a channel therebetween. Distal ends of at least part of the fins located away from the inner surface together form a covering structure partially coving the channel. The metallic partition is located between and welded to the covering structure and the cover.

Another embodiment of the disclosure provides a manufacturing method of a liquid cooling device. The manufacturing method includes forming a plurality of fins on a thermally conductive base, forming a covering structure on ends of the fins to partially cover a plurality of channels between the fins, and welding a metallic partition on the covering structure.

According to the liquid cooling device and manufacturing method as discussed in the above embodiments, the metallic partition is welded to the covering structure and the cover, thus the liquid cooling device has a rigid and strong structure. Also, the covering structure partially covering the channels between these fins prevents the welding material from entering into the channels during the welding process of the metallic partition. That is, without the covering structure, the welding material produced during the welding process of the metallic partition will fall into the channels.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

These and other embodiments are discussed below with reference to FIGS. 1-4, where FIGS. 1 to 4 depict a perspective view, an exploded view, a cross-sectional view, and a partially enlarged cross-sectional view of a liquid cooling device 10 according to one embodiment of the disclosure In this embodiment, the liquid cooling device 10 is made of any well-known material suitable for absorbing heat from a computer component, such as the central processing unit or graphic processing unit. The material of the liquid cooling device 10 may include gold, silver, copper, and/or aluminum. Thus, the liquid cooling device 10 may be served as a water block or cold plate for absorbing heat from a heat source (not shown).

In this embodiment, the liquid cooling device 10 may include a thermally conductive base 100, a cover 200, and a metallic partition 300. The thermally conductive base 100 may be made of gold, silver, copper, and/or aluminum. The thermally conductive base 100 has a fluid chamber 110 and a plurality of fins 120 protruding from an inner surface 111 of the thermally conductive base 100 facing the cover 200 and located in the fluid chamber 110. Every two of the fins 120 adjacent to each other define a channel G therebetween. In this embodiment, the fins 120 may be produced by extrusion, casting, skiving, or milling, but the present disclosure is not limited thereto.

The thermally conductive base 100 further has a covering structure 130. The covering structure 130 may be a flat plate that is formed at distal ends of at least some of the fins 120 located away from the inner surface 111 and partially covers the channels G between these fins 120.

In addition, the thermally conductive base 100 further has a contact surface 140 facing away from the inner surface 111 and configured to be in thermal contact with the heat source.

The cover 200 may be made of gold, silver and/or copper. The cover 200 has an inlet 210 and an outlet 220 respectively configured to be in fluid communication with an outlet and an inlet of a radiator via tubing (not shown), thereby creating a liquid cooling loop. The cover 200 is mounted on the thermally conductive base 100 to cover the fluid chamber 110. As shown, the inlet 210 is in fluid communication with the outlet 220 via the fluid chamber 110.

Two opposite surfaces of the metallic partition 300 are respectively fixed to the covering structure 130 and the cover 200 by welding. In this embodiment, the metallic partition 300 has a first through hole 310, and the covering structure 130 has an opening 131 in fluid communication with and located between the first through hole 310 and the channels G. The first through hole 310 and the opening 131 are in fluid communication with and located between the inlet 210 and the channels G. In addition, the metallic partition 300 further has two second through holes 320 and a third through hole 330, where the channels G are in fluid communication with the outlet 220 via the second through holes 320 and the third through hole 330.

As discussed, the metallic partition 300 is welded to the covering structure 130 and the cover 200, thus the liquid cooling device 10 has a rigid and strong structure. Also, the covering structure 130 partially covering the channels G between these fins 120 prevents the welding material from entering into the channels G during the welding process of the metallic partition 300. That is, without the covering structure 130, the welding material produced during the welding process of the metallic partition 300 will fall into the channels G.

Figure 1:
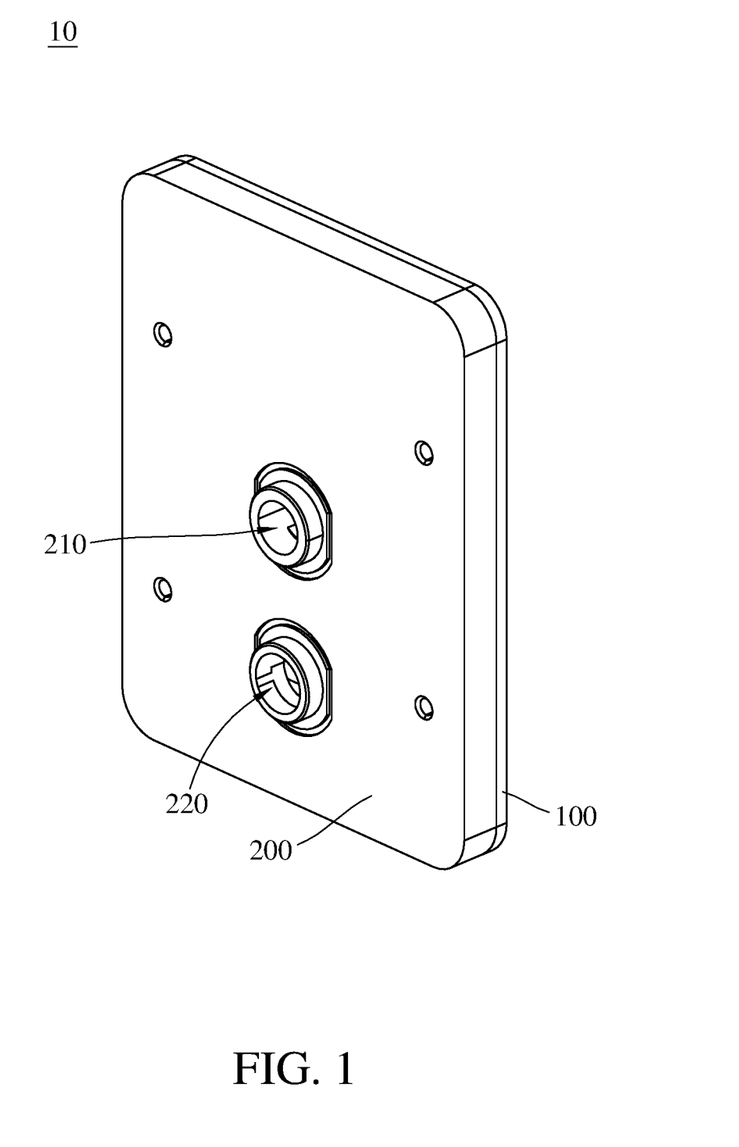
FIG. 1 is a perspective view of a liquid cooling device according to one embodiment of the disclosure.
Figure 2:
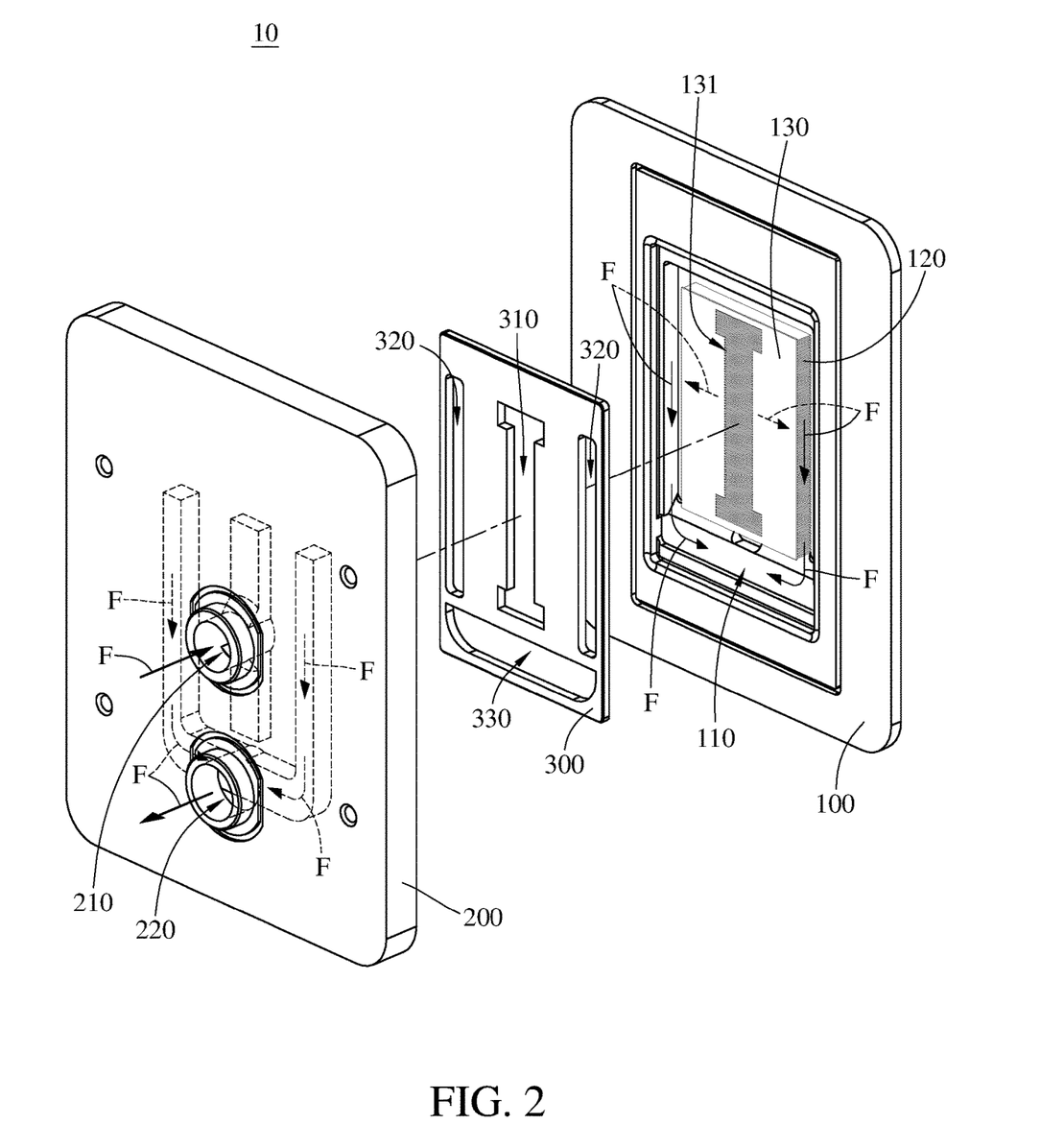
FIG. 2 is an exploded view of the liquid cooling device in FIG. 1.
Figure 3:
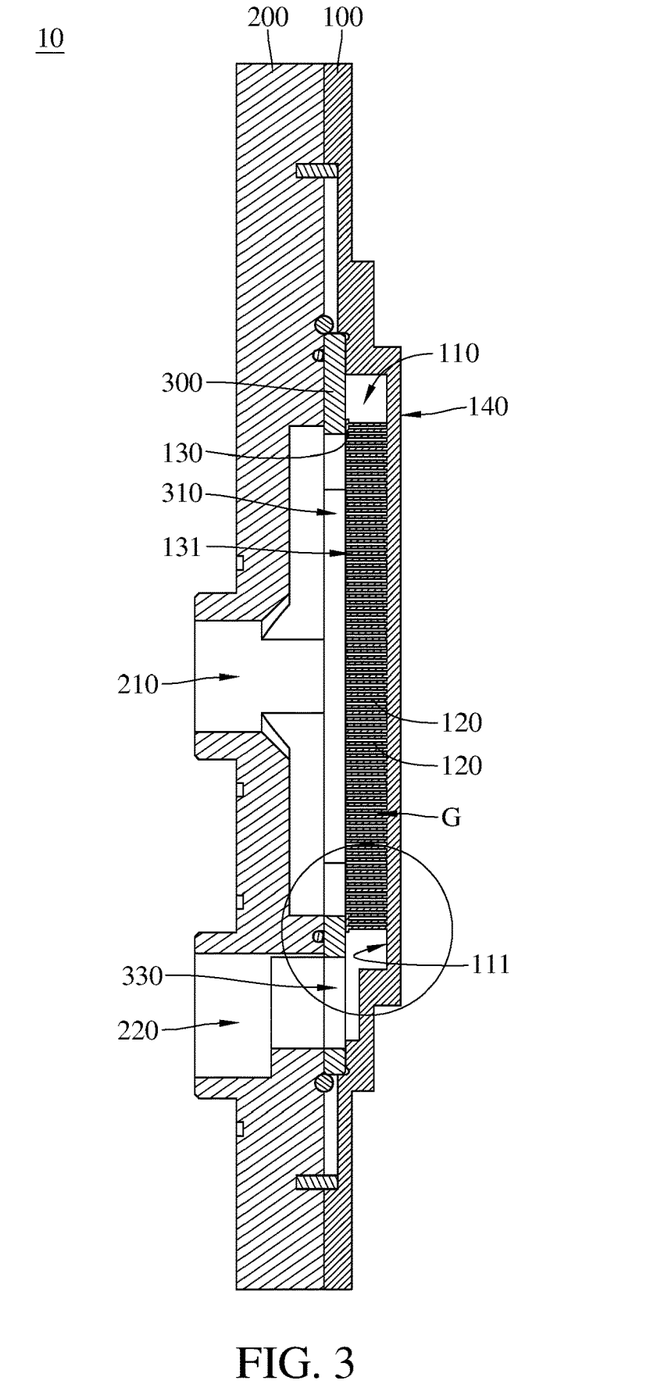
FIG. 3 is a cross-sectional view of the liquid cooling device in FIG. 1.
Figure 4:
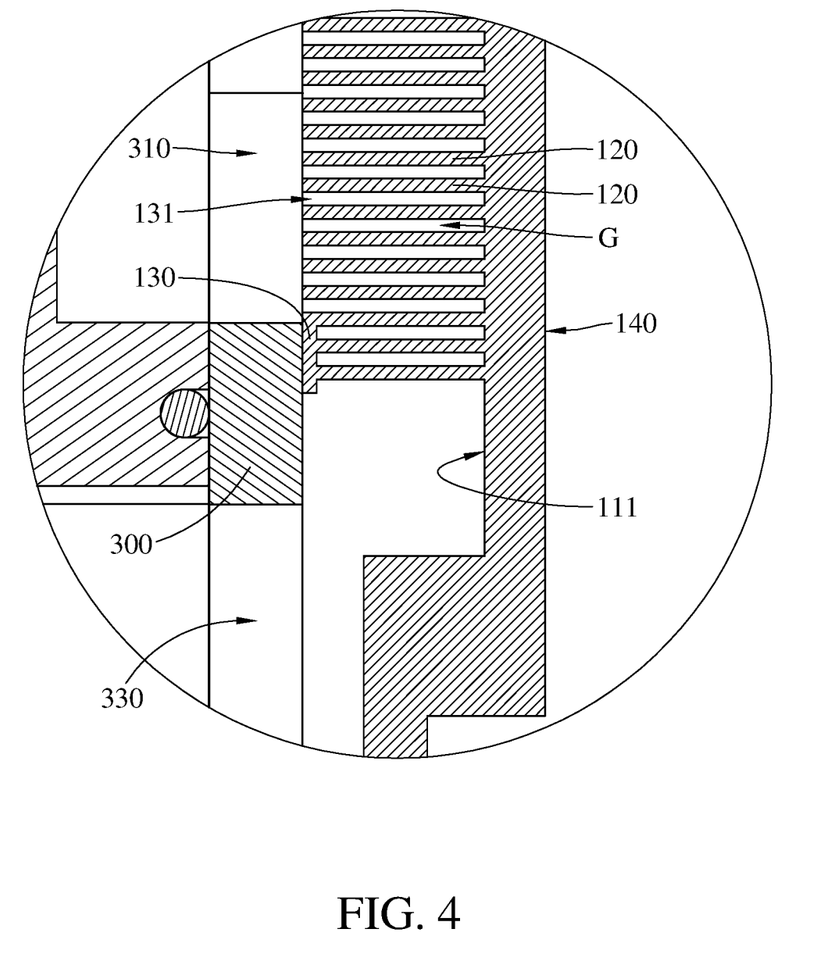
FIG. 4 is a partially enlarged cross-sectional view of the liquid cooling device in FIG. 1.

As shown in FIG. 2, the arrow F indicates the flow of the working fluid. As depicted, the working fluid flows into the channels G of the liquid cooling device 10 via the inlet 210, the first through hole 310, and the opening 131, flows along the channels G to their two opposite ends, and then flows through the second through holes 320, the third through hole 330, and the outlet 220 to flow out of the liquid cooling device 10.

Figure 5:
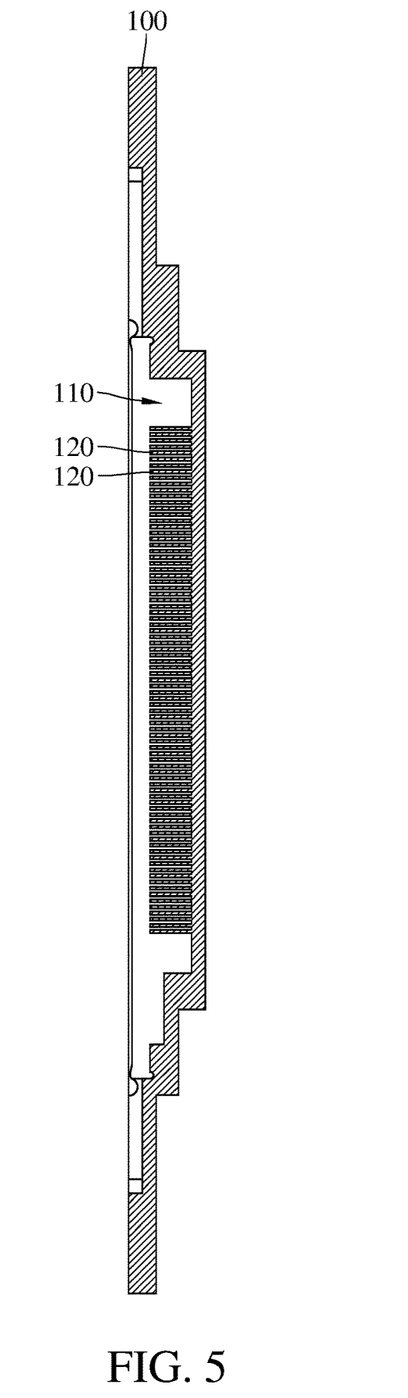
FIGS. 5 to 7 shows a manufacturing method of the liquid cooling device in FIG. 1.
Figure 6:
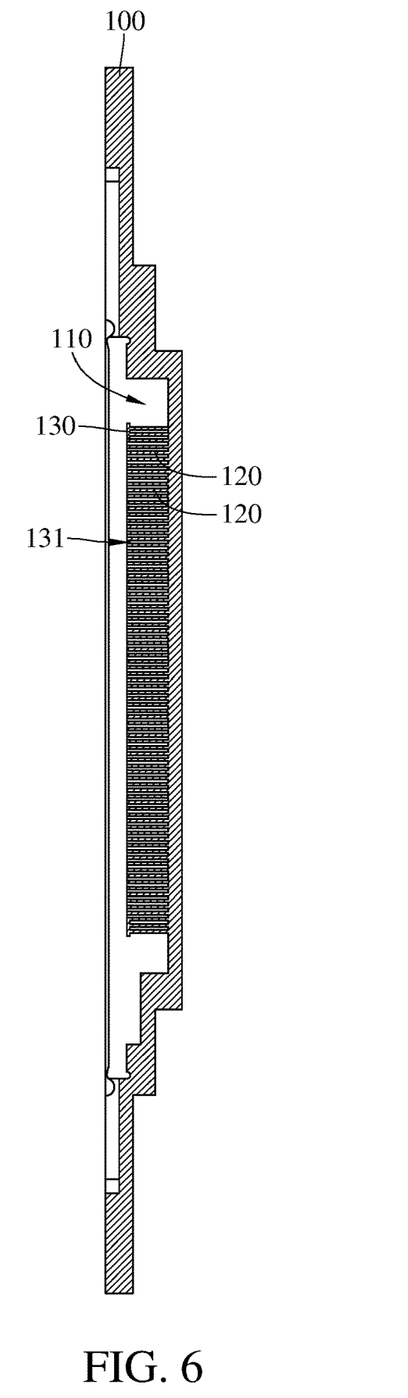
Figure 7:
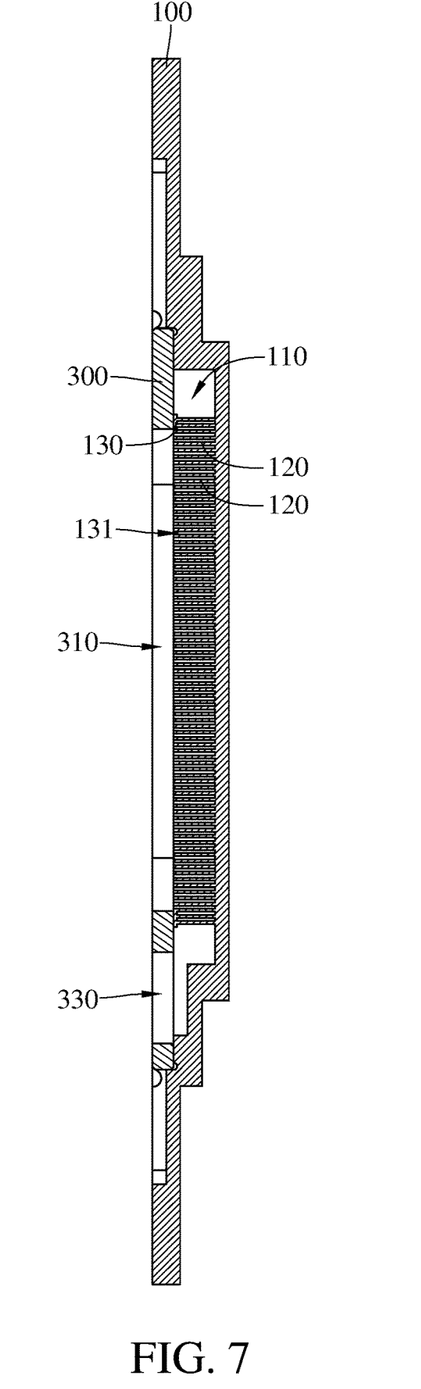

Then, referring to FIGS. 5 to 7, a manufacturing method of the liquid cooling device 10 is depicted. In FIG. 5, the first step is to form the fins 120 on the thermally conductive base 100 by any suitable process, such as extrusion, casting, skiving, or milling process. In FIG. 6, the second step is to compress ends of the fins 120 to form the covering structure 130 partially covering the channels G between these fins 120. Then, in FIG. 7, the third step is to attach the metallic partition 300 onto the covering structure 130 by, for example, welding. Then, the cover 200 (shown in FIGS. 3 and 4) is welded to the surface of the metallic partition 300 facing away from the covering structure 130.

According to the liquid cooling device and manufacturing method as discussed in the above embodiments, the metallic partition is welded to the covering structure and the cover, thus the liquid cooling device has a rigid and strong structure. Also, the covering structure partially covering the channels between these fins prevents the welding material from entering into the channels during the welding process of the metallic partition. That is, without the covering structure, the welding material produced during the welding process of the metallic partition will fall into the channels.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A liquid cooling device, comprising:
a thermally conductive base, having a fluid chamber and a plurality of fins, wherein the plurality of fins are located in the fluid chamber and protrudes from an inner surface of the thermally conductive base facing the fluid chamber, every two of the plurality of fins located adjacent to each other define a channel therebetween, distal ends of at least adjacent three of the plurality of fins located away from the inner surface together form a covering structure integrally formed as one piece with the at least adjacent three of the plurality of fins, and the covering structure partially covers the channel and extends between the at least adjacent three of the plurality of fins, the covering structure has an opening in fluid communication with the channel;
a cover, having an inlet and an outlet, wherein the cover is mounted on the thermally conductive base and covers the fluid chamber, and the inlet is in fluid communication with the outlet via the fluid chamber; and
a metallic partition, located between and welded to the covering structure and the cover.

2. The liquid cooling device according to claim 1, wherein the plurality of fins are formed by skiving process.

3. The liquid cooling device according to claim 1, wherein the metallic partition has a first through hole, the first through hole is in fluid communication with the channel via the opening, and the inlet is in fluid communication with the outlet via the first through hole, the opening, and the channel in the fluid chamber.

4. The liquid cooling device according to claim 1, wherein the thermally conductive base has a contact surface facing away from the inner surface.

5. A manufacturing method of a liquid cooling device, comprising:
forming a plurality of fins on a thermally conductive base;
forming a covering structure integrally formed as one piece with the plurality of fins on ends of the plurality of fins, wherein the covering structure partially covers a plurality of channels between the plurality of fins, and the covering structure extends between at least three of the plurality of fins which are adjacent, the covering structure has an opening in fluid communication with the plurality of channels; and welding a metallic partition on the covering structure.

6. The manufacturing method according to claim 5, further comprising welding a cover on a surface of the metallic partition facing away from the covering structure.

7. The manufacturing method according to claim 5, wherein the plurality of fins are formed by skiving process.

8. The manufacturing method according to claim 5, wherein the step of forming the covering structure on the ends of the plurality of fins comprises compressing the ends of the plurality of fins to form the covering structure.

* * * * *